United States Patent
Cho

(10) Patent No.: US 7,741,174 B2
(45) Date of Patent: Jun. 22, 2010

(54) METHODS OF FORMING PAD STRUCTURES AND RELATED METHODS OF MANUFACTURING RECESSED CHANNEL TRANSISTORS THAT INCLUDE SUCH PAD STRUCTURES

(75) Inventor: Kyoung-Yong Cho, Seoul (KR)

(73) Assignee: Samsung Electronics Co., Ltd. (KR)

( * ) Notice: Subject to any disclaimer, the term of this patent is extended or adjusted under 35 U.S.C. 154(b) by 331 days.

(21) Appl. No.: 12/017,449

(22) Filed: Jan. 22, 2008

(65) Prior Publication Data

US 2008/0182399 A1 Jul. 31, 2008

(30) Foreign Application Priority Data

Jan. 30, 2007 (KR) .................. 10-2007-0009243

(51) Int. Cl.
*H01L 21/8242* (2006.01)
(52) U.S. Cl. .................. 438/242; 438/259; 438/672; 257/E21.655
(58) Field of Classification Search .................. 438/241, 438/242, 259, 270, 672, 675; 257/E21.655
See application file for complete search history.

(56) References Cited

FOREIGN PATENT DOCUMENTS

| KR | 155831 | 7/1998 |
|---|---|---|
| KR | 1020030056321 A | 7/2003 |
| KR | 533956 | 11/2005 |
| KR | 0620655 A | 8/2006 |

*Primary Examiner*—Thanhha Pham
(74) *Attorney, Agent, or Firm*—Myers Bigel Sibley & Sajovec

(57) ABSTRACT

Methods of forming pad structures are provided in which a first contact region and second contact regions are formed in an active region of a substrate. An insulating interlayer is formed on the substrate. The insulating interlayer has a first opening that exposes the first contact region and the second contact regions. First conductive pads are formed in the first opening. Each first conductive pad is in electrical contact with a respective one of the second contact regions. Spacers are formed, where each spacer is on a sidewall of a respective one of the first conductive pads. Finally, a second conductive pad is formed between the first conductive pads and in electrical contact with the first contact region to complete the pad structure.

24 Claims, 14 Drawing Sheets

METHODS OF FORMING PAD STRUCTURES AND RELATED METHODS OF MANUFACTURING RECESSED CHANNEL TRANSISTORS THAT INCLUDE SUCH PAD STRUCTURES

CROSS-REFERENCE TO RELATED APPLICATION

This application claims priority under 35 U.S.C. §119 to Korean Patent Application No. 2007-9243, filed on Jan. 30, 2007, the contents of which are incorporated herein by reference in their entirety.

FIELD OF THE INVENTION

Embodiments of the present invention relate to semiconductor devices and, more particularly, to methods of forming pad structures for semiconductor devices.

BACKGROUND

As semiconductor devices have become more highly integrated, the size of the unit cells in the semiconductor devices has decreased. By way of example, the unit cells in state of the art dynamic random access memory (DRAM) devices now have widths of about 100 nm or less. To form such unit cells, semiconductor manufacturing tecliniques have been developed that may be used to form very small patterns, pads, contacts, and the like. One such technique is a self-alignment process that may be used to form extremely small contacts or pads.

Korean Laid-Open Patent Publication No. 2003-56321 discloses one conventional method of manufacturing a semiconductor device by employing such a self-alignment process. In this conventional self-alignment process, a gate structure is formed on a substrate that has an active region and a field region defined therein. The gate structure includes a gate oxide pattern, a gate electrode and a gate mask. A spacer is formed on a sidewall of the gate structure, and then a contact region is formed in the substrate adjacent to the gate structure. After an insulating interlayer is formed on the substrate to cover the gate structure, a photoresist pattern is formed on the insulating interlayer. Using the photoresist pattern as an etching mask, the insulating interlayer is partially etched using the self-alignment process to form a contact hole that exposes the contact region. Then, a self-aligned contact (SAC) is formed in the contact hole. Because of the self-alignment process, the semiconductor device may have a high degree of integration. However, in some cases, semiconductor devices that are manufactured using the self-alignment process may have poor electrical characteristics.

Semiconductor devices having recessed channel transistors have also been developed. These devices may facilitate providing a proper channel length and may exhibit reduced junction leakage current, particularly in semiconductor devices having unit cell widths of less than about 100 nm. To form these recessed channel transistors, a recess is formed at in upper portion of a substrate by etching the substrate. A gate structure is formed in the recess. An insulating interlayer is then formed on the substrate, and the insulating interlayer is partially etched using an etching mask to form a contact hole that exposes a contact region of the substrate. A pad or a contact that makes contact with the contact region is formed in the contact hole.

SUMMARY

Pursuant to some embodiments of the present invention, methods of forming pad structures are provided in which a first contact region and second contact regions are formed in an active region of a substrate. An insulating interlayer is formed on the substrate. The insulating interlayer has a first opening that exposes the first contact region and the second contact regions. First conductive pads are formed in the first opening. Each first conductive pad is in electrical contact with a respective one of the second contact regions. Spacers are formed, where each spacer is on a sidewall of a respective one of the first conductive pads. Finally, a second conductive pad is formed between the first conductive pads and in electrical contact with the first contact region to complete the pad structure.

In some embodiments, the first conductive pads may be formed in the first opening by forming a conductive layer pattern in the first opening on the first contact region and the second contact regions and then etching the conductive layer pattern to form a second opening that exposes the second contact region and divides the conductive layer pattern into the first conductive pads. In such embodiments, the width of the second opening along a major axis of the active region may exceed a width of the first contact region along the major axis of the active region. The sidewall of each of the spacers may be substantially aligned with a respective sidewall of the first contact region. The width of second conductive pad along the major axis of the active region may also be substantially greater than the width of each of the first conductive pads along the major axis of the active region. The width of each spacer along the major axis of the active region may be substantially smaller that the widths of each of the first conductive pads and the width of the second conductive pad along the major axis of the active region.

A recessed gate structure may also be formed as part of the above-described methods. This may be accomplished, for example, by forming a recess in the active region, forming a gate insulation layer inside the recess, forming a gate electrode on the gate insulation layer to partially fill the recess; and then forming a gate mask on the gate electrode. A second recessed gate structure may also be formed in the active region. In some embodiments, the upper surface of the gate mask may be substantially planar with an upper surface of the substrate.

Pursuant to further embodiments of the present invention, methods of manufacturing a semiconductor device are provided in which a recessed channel transistor is formed in an active region of a substrate. The recessed channel transistor may include a recessed gate structure, a first contact region and second contact regions. A first insulating interlayer is formed on the substrate, and then etched to form a first opening that exposes the active region. A first conductive layer pattern is formed in the first opening, and is then etched to form a second opening that exposes the first contact region. This second opening divides the first conductive layer pattern into first conductive pads. Spacers is formed, where each spacer is on a sidewall of a respective one of the first conductive pads. Finally, a second conductive pad is formed in the second opening.

In some of these methods, the upper surface of the recessed gate structure may be substantially planar with an upper surface of the substrate. The second conductive pad may be formed by forming a second conductive layer on the first conductive pads, on the first insulating interlayer and within the second opening, and then, removing an upper surface of the second conductive layer to expose the first conductive pads. The second conductive pad may directly contact the first contact region, and each of the first conductive pads may directly contact a respective one of the second contact regions. Additionally, a portion of the recessed gate structure may be exposed through the second opening. A sidewall of each of the spacers may be substantially aligned with a respective sidewall of the first contact region. In some embodiments, the spacers may be formed by conformally forming a spacer formation layer on a bottom and sidewalls of the second opening, the first conductive pads and the first insulating interlayer, and then, partially removing the spacer formation layer to expose the first contact region.

These methods may also include forming a second insulating interlayer on the first insulating interlayer, the first conductive pads, the spacers and the second conductive pad. The second insulating interlayer may be etched to form a first contact hole that exposes the second conductive pad. A wiring may be formed on the second insulating interlayer and in the first contact hole. A third insulating interlayer may then be formed on the second insulating interlayer and on the wiring. The third insulating interlayer may be etched to form second contact holes that expose respective ones of the first conductive pads. Third conductive pads may be formed in respective ones of the second contact holes such that each of the third conductive pads is in direct contact with a respective one of the first conductive pads.

BRIEF DESCRIPTION OF THE DRAWINGS

The above and other features and advantages of the present invention will become more apparent by describing in detail example embodiments thereof with reference to the accompanying drawings, in which.

DETAILED DESCRIPTION

Figure 1A:
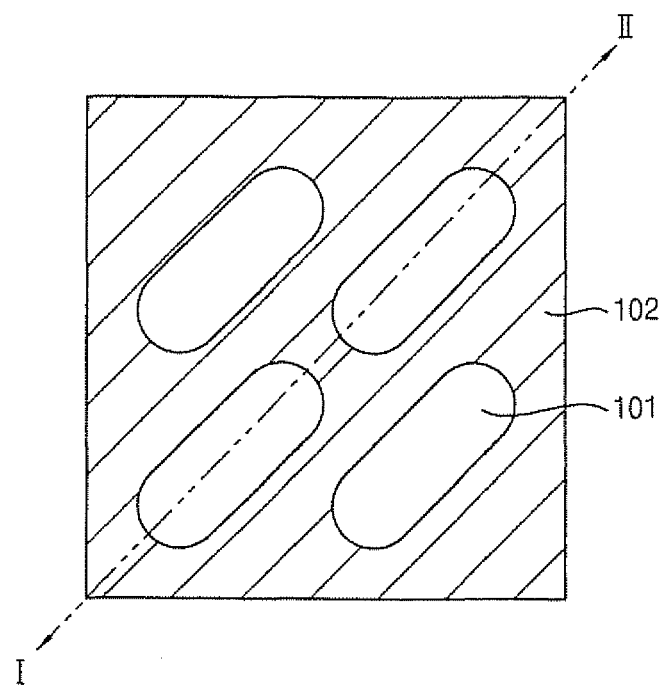
FIGS. 1A to 1G are plan views illustrating methods of manufacturing semiconductor devices in accordance with certain embodiments of the present invention.

The present invention is described more fully hereinafter with reference to the accompanying drawings, in which example embodiments of the present invention are shown. The present invention may, however, be embodied in many different forms and should not be construed as limited to the example embodiments set forth herein. Rather, these embodiments are provided so that this disclosure will be thorough and complete, and will fully convey the scope of the present invention to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprises" and/or "includes" (and variations thereof), when used in this specification, specify the presence of stated features, integers, steps, operations, elements, and/or components, but do not preclude the presence or addition of one or more other features, integers, steps, operations, elements, components, and/or groups thereof.

Example embodiments of the present invention are described herein with reference to cross-section illustrations that are schematic illustrations of idealized embodiments (and intermediate structures) of the present invention. As such, variations from the shapes of the illustrations as a result, for example, of manufacturing techniques and/or tolerances, are to be expected. Thus, example embodiments of the present invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined in this specification.

FIGS. 1A to 1G are plan views taken along lines I-II in FIGS. 1A to 1G, respectively, illustrating methods of manufacturing semiconductor devices that include pad structures and recessed channel transistors in accordance with example embodiments of the present invention. FIGS. 2A to 2G are cross-sectional views illustrating methods of manufacturing semiconductor devices in accordance with example embodiments of the present invention.

Figure 2A:
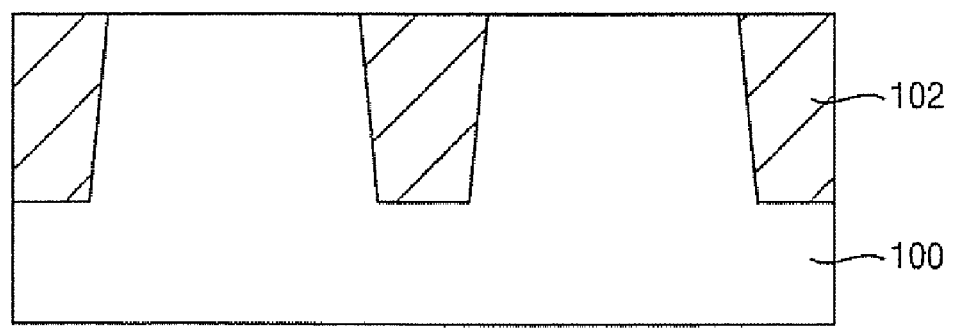
FIGS. 2A to 2G are cross-sectional views taken along the lines I-II of FIGS. 1A to 1G, respectively.

As illustrated in FIGS. 1A and 2A, pursuant to these methods an isolation layer 102 is formed in a substrate 100 by an isolation process to define an active region 101 and a field region in the substrate 100. The substrate 100 may comprise, for example, a silicon substrate, a germanium substrate, a silicon-germanium substrate, a silicon-on-insulator (SO) substrate, a germanium-on-insulator (GOI) substrate, a silicon epitaxial layer, a germanium epitaxial layer, etc. The isolation layer 102 may be formed, for example, by a trench isolation process and may be formed using an oxide such as silicon oxide. The field region of the substrate 100 may correspond to the isolation layer 102. The active region 101 may be surrounded by the field region. Thus, adjacent active regions 101 may be isolated from each other by the isolation layer 102 as illustrated in FIG. 1A.

Figure 1B:
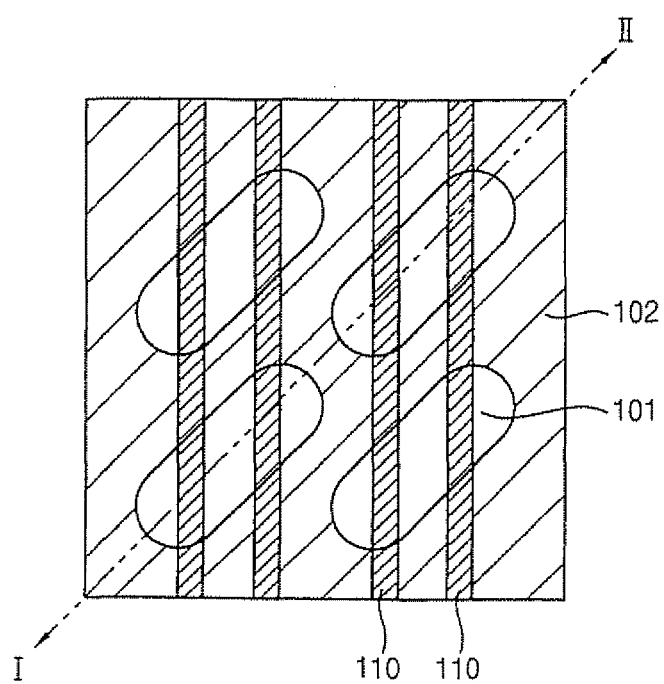
Figure 2B:
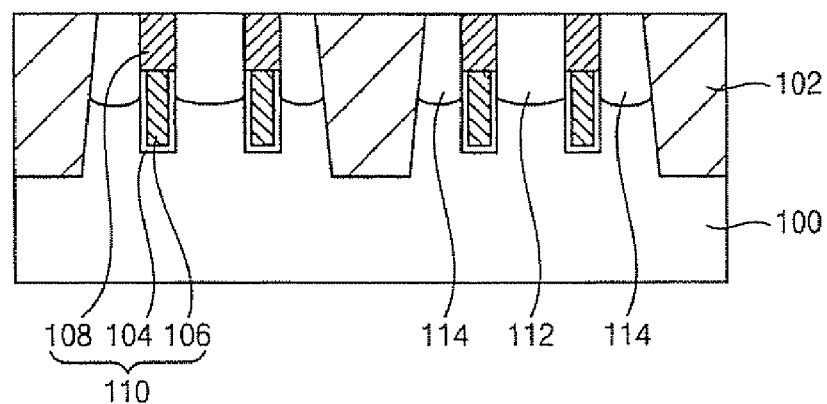

Referring to FIGS. 1B and 2B, a recessed channel transistor having a recessed channel is formed in the active region 101 of the substrate 100. The recessed channel transistor includes a gate structure 110, a first contact region 112 and second contact regions 114. The gate structure 110 includes a gate insulation layer pattern 104, a gate electrode 106 and a gate mask 108.

In forming the recessed channel transistor according to some embodiments of the present invention, a pad oxide layer (not illustrated) may be formed on the substrate 100, and then a mask layer (not illustrated) may be formed on the pad oxide layer. The pad oxide layer may be formed, for example, by a thermal oxidation process, and the mask layer may be formed by, for example, a chemical vapor deposition (CVD) process or a plasma enhanced chemical vapor deposition (PECVD) process. The pad oxide layer may act as a buffer layer that may reduce a stress that is generated between the substrate 100 and the mask layer. The mask layer may serve as an etching mask in a successive etching process. The mask layer may be formed using, for example, silicon nitride or silicon oxynitride. The mask layer and the pad oxide layer may be patterned by a photolithography process to form a pad oxide layer pattern (not illustrated) and a first mask (not illustrated) on the substrate 100. The first mask may selectively expose a portion of the active region 101 where a recess is to be formed. Using the first mask as an etching mask, the exposed portion of the active region 101 may be partially etched to form the recess in the substrate 100. The recess may be formed by, for example, an anisotropic etching process. The recess may have a sidewall that is substantially perpendicular to the plane of the substrate 100.

A gate insulation layer (not illustrated) is formed on a sidewall and the bottom of the recess and on the active region 101. The gate insulation layer may be formed by, for example, a thermal oxidation process or a CVD process. The gate insulation layer may be formed using an oxide such as silicon oxide when the substrate 100 includes silicon.

A conductive layer is formed on the gate insulation layer and in the recess. The conductive layer may be formed using, for example, a metal, a metal compound, polysilicon doped with impurities, etc. For example, the conductive layer may be formed using tungsten (W), titanium (Ti), tantalum (Ta), aluminum (Al), tungsten nitride ($WN_x$), titanium nitride ($TiN_x$), tantalum nitride ($TaN_x$), etc. The conductive layer may be formed by a CVD process, a PECVD process, an atomic layer deposition (ALD) process, a sputtering process, etc.

Referring now to FIGS. 1B and 2B, the conductive layer and the gate insulation layer are partially etched to expose the substrate 100. The gate insulation layer and the conductive layer may be somewhat over-etched so that upper faces of the gate insulation layer pattern 104 and the gate electrode 106 are substantially lower than an upper face of the substrate 100. In other words, the gate insulation layer pattern 104 and the gate electrode 106 may only partially fill the recess.

The gate mask 108 is formed on the gate insulation layer pattern 104 and the gate electrode 106. The gate mask 108 may fill the remainder of the recess. The upper face of the gate mask 108 may be substantially even with the upper face of the substrate 100. The gate mask 108 may be formed of, for example, an oxide, a nitride, or an oxynitride. For example, the gate mask 108 may be formed using silicon oxide, silicon nitride, silicon oxynitride, etc. The gate mask 108 may be formed by a CVD process, a PECVD process, an ALD process, a high density plasma-chemical vapor deposition (HDP-CVD) process, etc.

When the gate mask 108 is formed on the gate insulation layer pattern 104 and the gate electrode 106, the gate structure 110 is provided in the recess. In some example embodiments, the lower portion of the recess may be filled with the gate insulation layer pattern 104 and the gate electrode 106, whereas the upper portion of the recess may be filled with the gate mask 108. Two gate structures 110 may be provided in each of the active regions 101.

Using the gate structure 110 as an implantation mask, impurities are doped into portions of the substrate 100 adjacent to the gate structure 110 to form the first and the second contact regions 112 and 114 in the active region 101. Each gate structure 110 is in between the first contact region 112 and one of the second contact regions 114. In some embodiments, the first and second contact regions 112 and 114 may include impurities from Group III or Group V of the Periodic Table of Elements in accordance with a desired transistor type. For example, the first and second contact regions 112 and 114 may include elements from Group V when the recessed channel transistor is an N-type transistor. In some example embodiments, the first contact region 112 and the second contact regions 114 may correspond to a bit line contact region and capacitor contact regions, respectively.

Figure 1C:
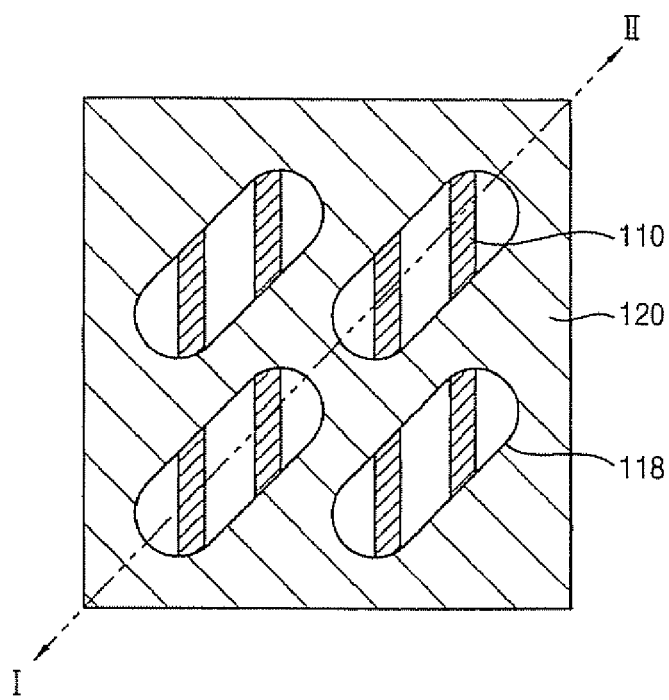
Figure 2C:
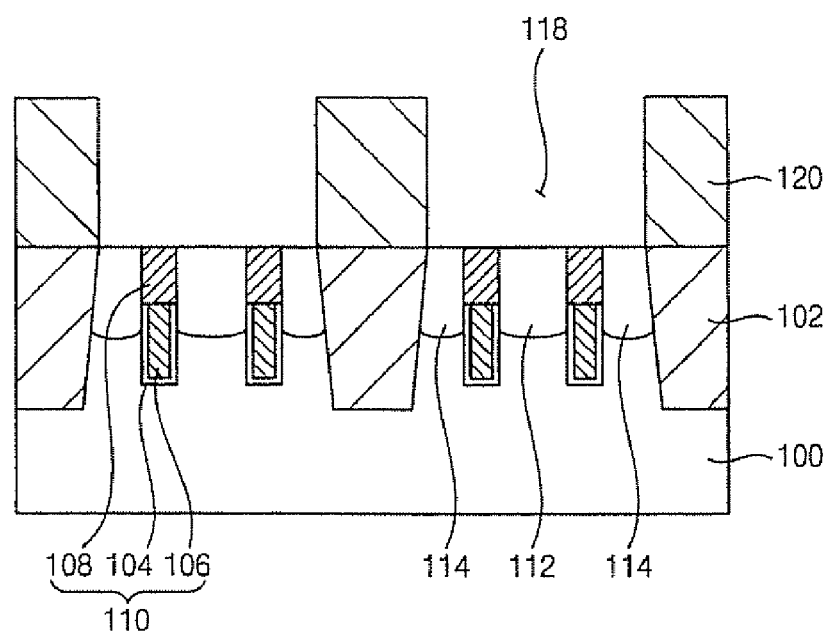

Referring to FIGS. 1C and 2C, a first insulating interlayer 120 is formed on the substrate 100 to cover the recessed channel transistor. The first insulating interlayer 120 may be formed using an oxide such as boro-phosphor silicate glass (BPSG), phosphor silicate glass (PSG), undoped silicate glass (USG), spin-on-glass (SOG), flowable oxide (FOX), plasma enhanced-tetraethylorthosilicate (PE-TEOS), etc.

In some embodiments, the first insulating interlayer 120 may be flattened by a planarization process. For example, the first insulating interlayer 120 may be planarized by an etch-back process and/or a chemical mechanical polishing (CMP) process.

A second mask (not illustrated) is formed on the first insulating interlayer 120. The second mask may be formed using a material that has an etching selectivity relative to the first insulating interlayer 120. For example, the second mask may be formed using photoresist, silicon nitride, silicon oxynitride, etc. The second mask may be positioned over the isolation layer pattern 102.

The first insulating interlayer 120 is partially etched using the second mask as an etching mask to form a first opening 118 that exposes the active region 101 of the substrate 100. As shown in FIG. 1C, the gate structure 110, the first contact region 112 and the second contact regions 114 may be exposed through the first opening 118. The gate structure 110 may extend on the active region 101 along a substantially diagonal direction relative to the major axis of the active region 101.

In one example embodiment, the first opening 118 may be formed by a wet etching process using an etching solution. The etching solution may include a LAL solution containing deionized water, ammonium fluoride and hydrogen fluoride. In other embodiments, the first opening 118 may be formed by a dry etching process using an etching gas. The etching gas may include anhydrous hydro fluoric acid, isopropyl alcohol (IPA) and/or water vapor.

In some example embodiments, metal silicide layer patterns (not illustrated) may be formed on the first and the second contact regions 112 and 114, respectively. The metal silicide layer patterns may be formed using titanium silicide, tantalum silicide, cobalt silicide, etc.

After the first opening 118 is formed, the second mask may be removed.

Figure 1D:
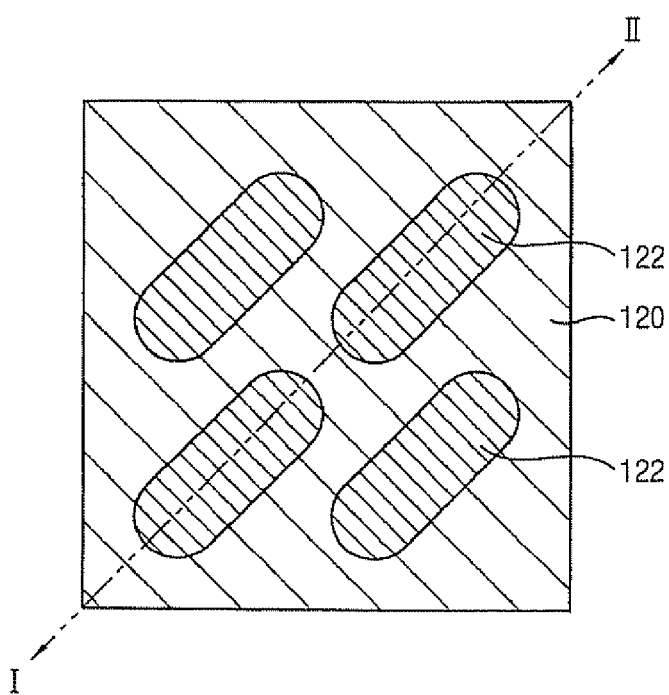
Figure 2D:
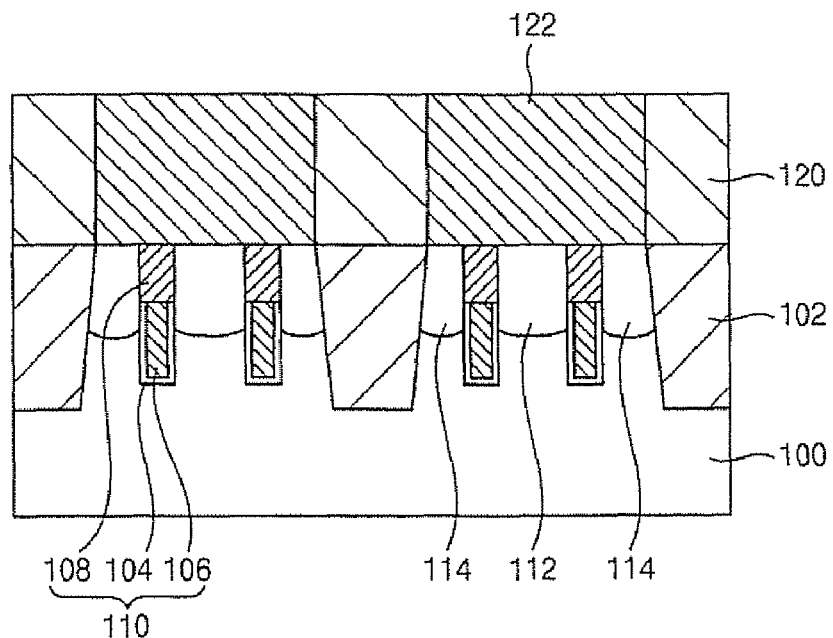

Referring to FIGS. 1D and 2D, a first conductive layer pattern 122 is formed on the active region 101 in the first opening 118 of the first insulating interlayer 120. The first conductive layer pattern 122 may thus be formed on the first contact region 112, the second contact regions 114 and the gate structures 110.

In some embodiments, the first conductive layer pattern 122 may be formed as follows. A first conductive layer (not illustrated) is formed on the first insulating interlayer 120 and in the first opening 118. The first conductive layer may be formed using polysilicon doped with impurities, a metal or a metal compound. For example, the first conductive layer may be formed using titanium, tungsten, tantalum, aluminum, copper, titanium nitride, aluminum nitride, tungsten nitride, tantalum nitride, etc. These may be used alone or in a mixture thereof. The first conductive layer may be formed by a CVD process, an ALD process, an LPCVD process, a sputtering process, a pulsed laser deposition (PLD) process, an evaporation process, etc.

The first conductive layer is partially removed to expose the first insulating interlayer 120, thereby forming the first conductive layer pattern 122. The first conductive layer pattern 122 may be formed by a CMP process and/or an etch-back process. The first conductive layer pattern 122 may be in direct contact with the first and second contact regions 112 and 114.

Figure 1E:
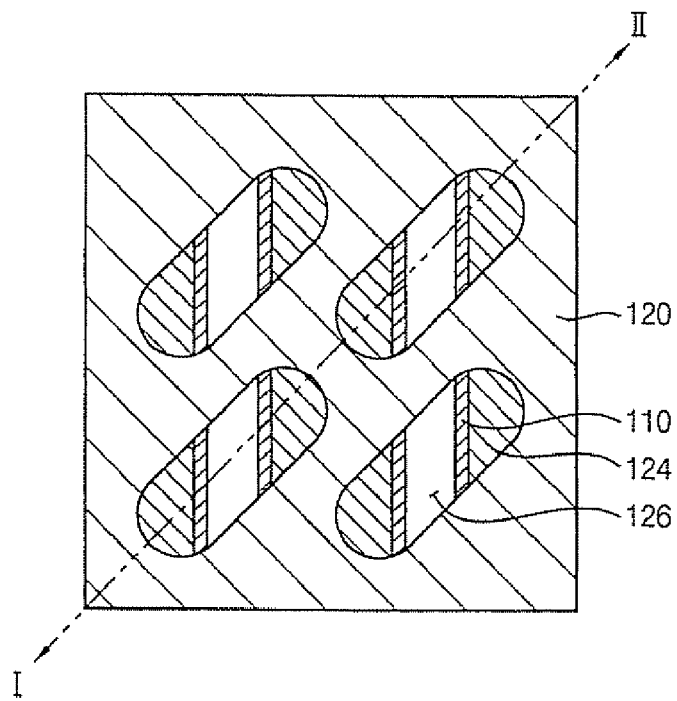
Figure 2E:
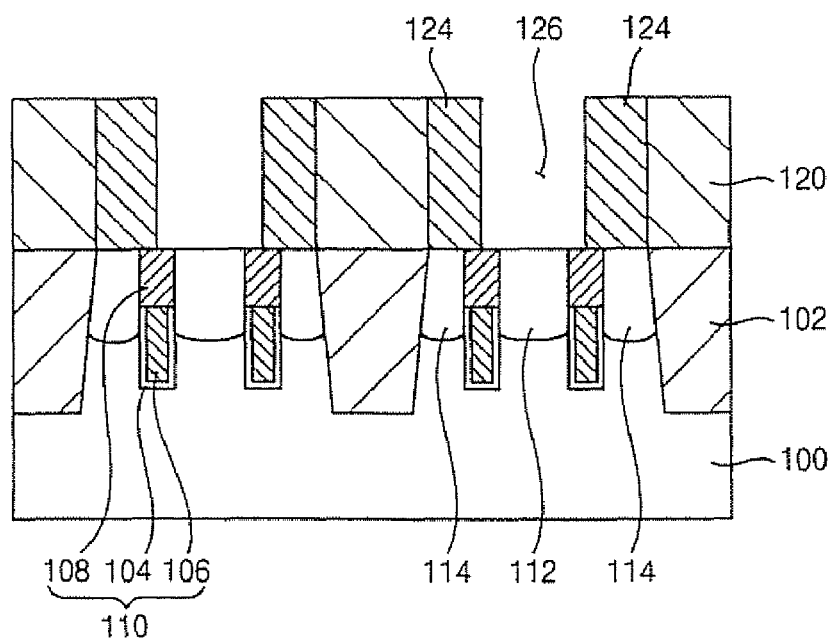

Referring to FIGS. 1E and 2E, the first conductive layer pattern 122 is partially etched to form a second opening 126 that exposes the first contact region 112. Formation of the second opening 126 divides the first conductive layer pattern 122 into two first conductive pads 124. The second opening 126 may be formed by, for example, a wet etching process or a dry etching process.

In some example embodiments, the second opening 126 may have a width (measured along the major axis of the active region 101) that is substantially wider than a width of the first contact region 112 so as to expose the first contact region 112 and portions of the gate structures 110. The first conductive pads 124 are separated from each other by the second opening 126. Each first conductive pad 124 makes electrical contact with a respective one of the second contact regions 114.

In some example embodiments, the second opening 126 may be formed by forming a third mask (not illustrated) on the first conductive layer pattern 122, and then etching the first conductive layer pattern 122 using the third mask as an etching mask. The third mask may be formed using a material having an etching selectivity relative to the first conductive layer pattern 122 and the first insulating interlayer 120. For example, the third mask may be formed using a nitride such as silicon nitride, or an oxynitride such as silicon oxynitride.

Figure 1F:
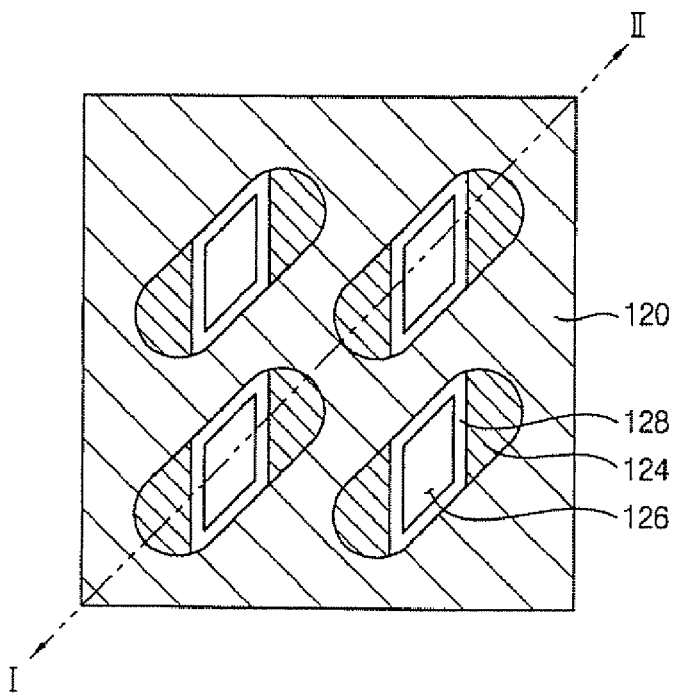
Figure 2F:
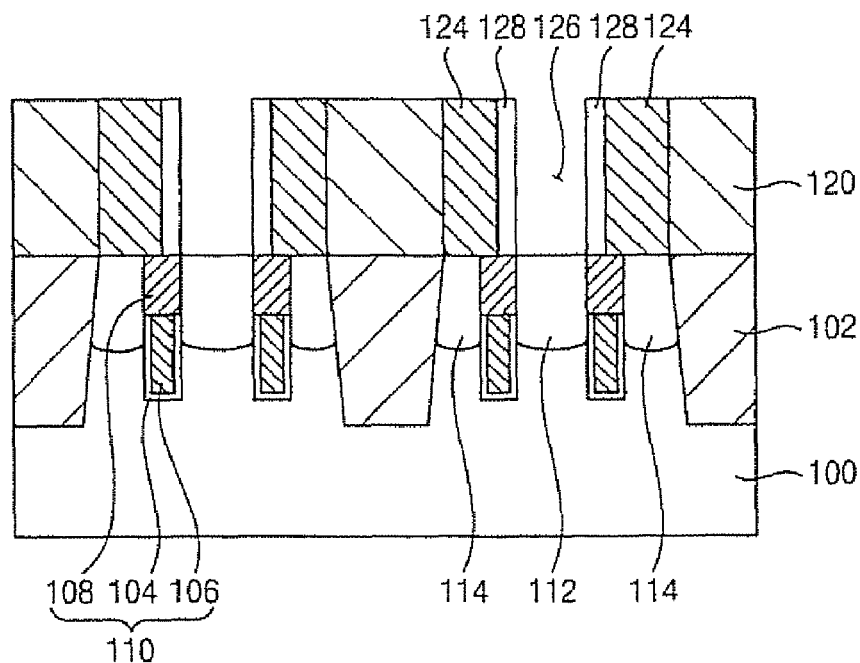

Referring to FIGS. 1F and 2F, spacers 128 are formed on sidewalls of the first conductive pads 124, respectively. Each of the spacers 128 may have a width that is substantially the same as a width difference between an edge of the second opening 126 and an edge of the first contact region 112. Accordingly, the sidewall of each spacer may be substantially aligned with a respective sidewalls of the first contact region 126.

In some example embodiments, the spacers 128 may be formed as follows. A spacer formation layer (not illustrated) is conformally formed on the structure having the second opening 126. The spacer formation layer may be formed using an oxide, a nitride or an oxynitride. For example, the spacer formation layer may be formed using silicon oxide, silicon nitride or silicon oxynitride. The spacer formation layer may have a thickness of about 100 Å to about 300 Å.

The spacer formation layer is etched until the first contact region 112 is exposed, thereby forming the spacers 128 on the sidewalls of the first contact pads 124. The spacers 128 may be formed by an anisotropic etching process. Each of the spacers 128 may have, for example, a cylindrical shape or a polygonal pillar shape. The spacers 128 may electrically insulate the first conductive pads 124 from a second conductive pad 130 that is formed in subsequent processing steps.

Figure 1G:
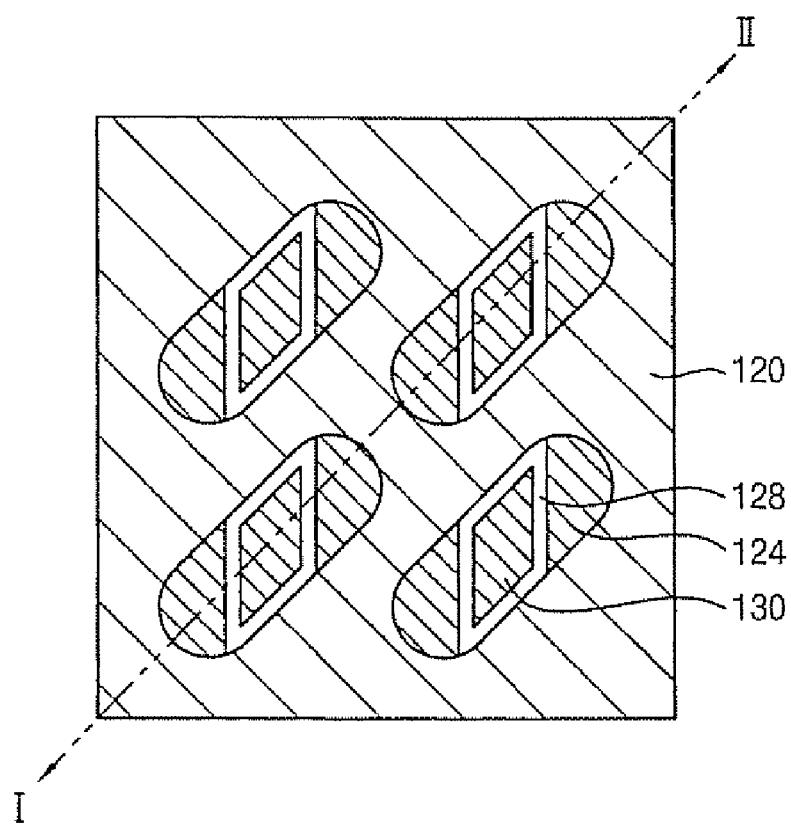
Figure 2G:
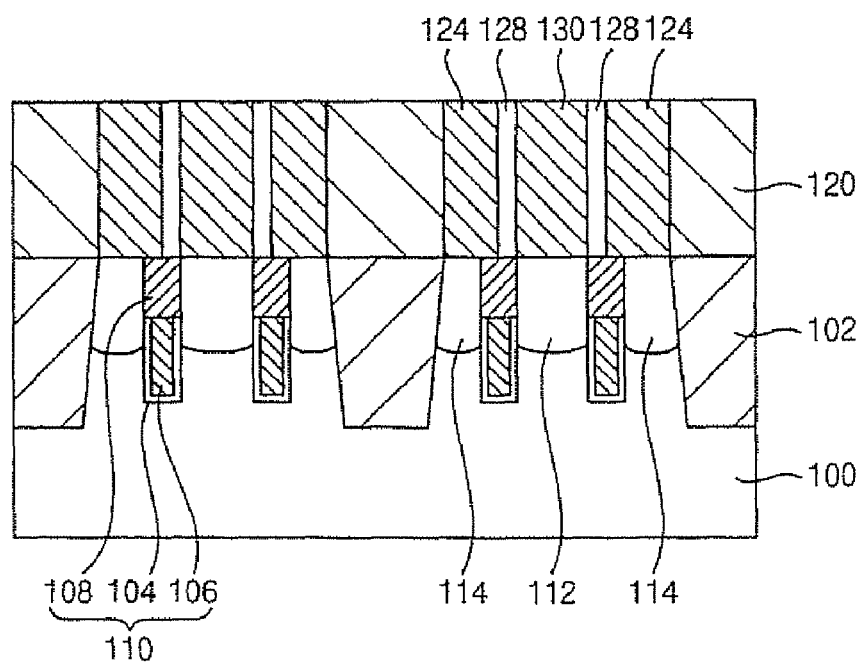

Referring to FIGS. 1G and 2G, the second conductive pad 130 is formed in the second opening 126. The second conductive pad 130 makes electrical contact with the first contact region 112.

In some example embodiments, the second conductive pad 130 may be formed as follows. A second conductive layer (not illustrated) is formed on the first conductive pads 124 and the first insulating interlayer 120. The second conductive layer may fill the second opening 126. The second conductive layer may be formed using a metal, a metal compound or polysilicon doped with impurities. For example, the second conductive layer may be formed using tungsten, titanium, aluminum, tantalum, copper, tungsten nitride, titanium nitride, tantalum nitride, aluminum nitride, etc. These may be used alone or in a mixture thereof. The second conductive layer may be formed by a sputtering process, a PLD process, a CVD process, an LPCVD process, an ALD process, an evaporation process, etc.

The second conductive layer is partially removed to expose the first insulating interlayer 120 and the first conductive pads 124 to form the second conductive pad 130 in the second opening 126. The second conductive pad 130 may be formed by a CMP process and/or an etch-back process. The second conductive pad 130 may make direct contact with the first contact region 112, whereas the first conductive pads 124 may make direct contact with respective ones of the second contact regions 114.

In some example embodiments, the second conductive pad 130 and the first conductive pads 124 may comprise substantially the same materials. In other embodiments, the second conductive pad 130 may be formed using a material different from the material(s) of the first conductive pads 124.

According to some example embodiments of the present invention, a pad structure including conductive pads may be formed at desired positions of a substrate without a self-alignment process. Additionally, an electrical insulation between adjacent conductive pads may be provided by interposing a spacer therebetween. Furthermore, conductive pads contacting different contact regions may be formed on the substrate with a relatively simple manufacturing process.

FIGS. 3A to 3H are cross-sectional views illustrating methods of manufacturing semiconductor devices that include recessed channel transistors in accordance with some embodiments of the present invention.

Figure 3A:
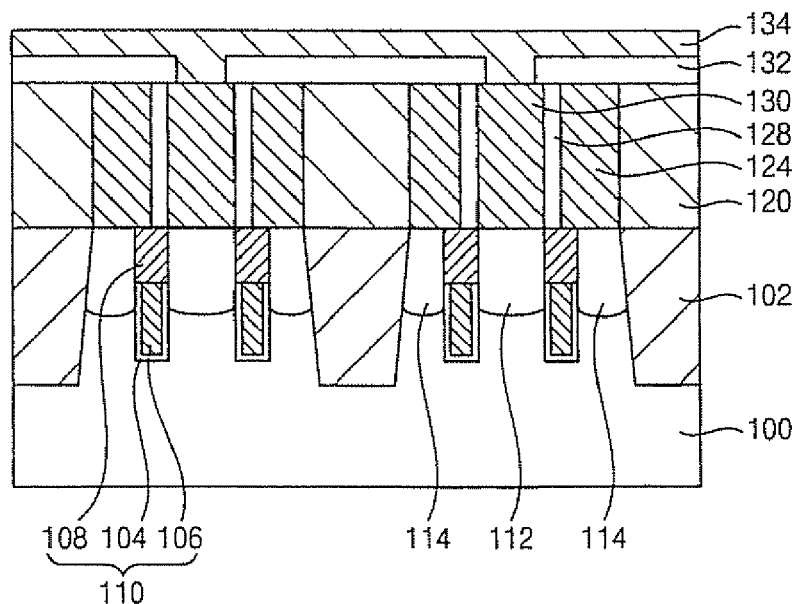
FIGS. 3A to 3H are cross-sectional views illustrating methods of manufacturing semiconductor devices that include recessed channel transistors in accordance with further embodiments of the present invention.

Referring to FIG. 3A, the processes described above with reference to FIGS. 2A to 2G, or similar processes, may be used to form first conductive pads 124 and a second conductive pad 130 on a substrate 100. Then, as shown in FIG. 3A, a second insulating interlayer 132 is formed on the first and the second contact pads 124 and 130. The second insulating interlayer 132 may be formed using an oxide such as silicon oxide by, for example, a CVD process, a PECVD process, an HDP-CVD process, etc. The second insulating interlayer 132 may electrically insulate the first conductive pads 124 from a bit line 134 that is formed in a subsequent processing step.

In some example embodiments, the second insulating interlayer 132 may be flattened by a planarization process. For example, the second insulating interlayer 132 may be planarized by a CMP process and/or an etch-back process.

As is also shown in FIG. 3A, the second insulating interlayer 132 is partially etched to form a first contact hole that exposes the second conductive pad 130. The first contact hole may be formed by a photolithography process. The first contact hole may correspond to a bit line contact hole and may be filled by a portion of the bit line 134. When a photoresist pattern is employed as an etching mask for forming the first contact hole, the photoresist pattern may be removed from the second insulating interlayer 132 by an ashing process and/or a stripping process.

A third conductive layer is formed on the second insulating interlayer 132. The third conductive layer may fill the first contact hole. The third conductive layer may be formed, for example, using doped polysilicon, metal and/or metal compound by a CVD process, an ALD process, a sputtering process, an LPCVD process, a PLD process, an evaporation process, etc.

The third conductive layer is patterned to form the bit line 134 on the second conductive pad 130 and the second insulating interlayer 132. In some embodiments, the bit line 134 may have a multi-layered structure that includes a first film of metal/metal compound and a second film of metal. In these embodiments, the first film may include titanium/titanium nitride and the second film may include tungsten.

Figure 3B:
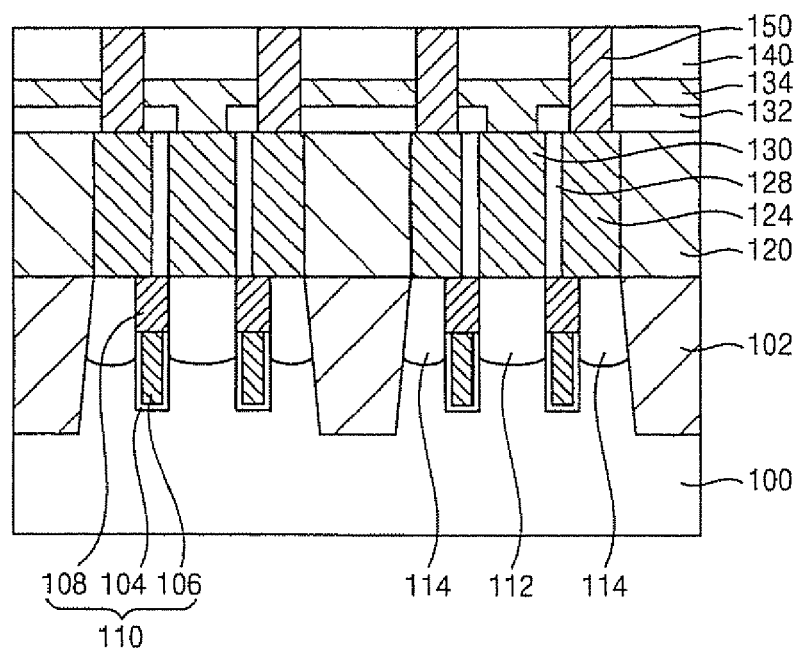

Referring to FIG. 3B, a third insulating interlayer 140 is formed on the second insulating interlayer 132 to cover the bit line 134. The third insulating interlayer 140 may be formed using an oxide such as BPSG, PSG, SOG, USG, FOX, PE-TEOS, HDP-CVD oxide, etc. by, for example, a CVD process, a PECVD process, an HDP-CVD process, etc.

After a photoresist pattern is formed on the third insulating interlayer 140, the third insulating interlayer 140 is partially etched using the photoresist pattern as an etching mask to form second contact holes through the third insulating interlayer 140 that expose the first conductive pads 124, respectively. The second contact holes may correspond to capacitor contact holes.

A fourth conductive layer is formed on the third insulating interlayer 140 to fill up the second contact holes, and then the fourth conductive layer is partially removed to expose the third insulating interlayer 140 to form third conductive pads 150 in the second contact holes. The fourth conductive layer may be formed using doped polysilicon, a metal or a metal nitride by a CVD process, a sputtering process, an ALD process, an LPCVD process, a PLD process, an evaporation process, etc. The third conductive pads 150 may be formed by a CMP process and/or an etch-back process. Each third conductive pad 150 makes contact with a respective one of the first conductive pads 124. In some embodiments, the third conductive pads 150 may include tungsten, aluminum, titanium, tantalum, copper, tungsten nitride, aluminum nitride, titanium nitride, tantalum nitride, etc. These may be used alone or in a mixture thereof. Each of the third conductive pads 150 may electrically connect the first conductive pad 124 to a lower electrode 170 (see FIG. 3F) that is formed in a subsequent processing step.

Figure 3C:
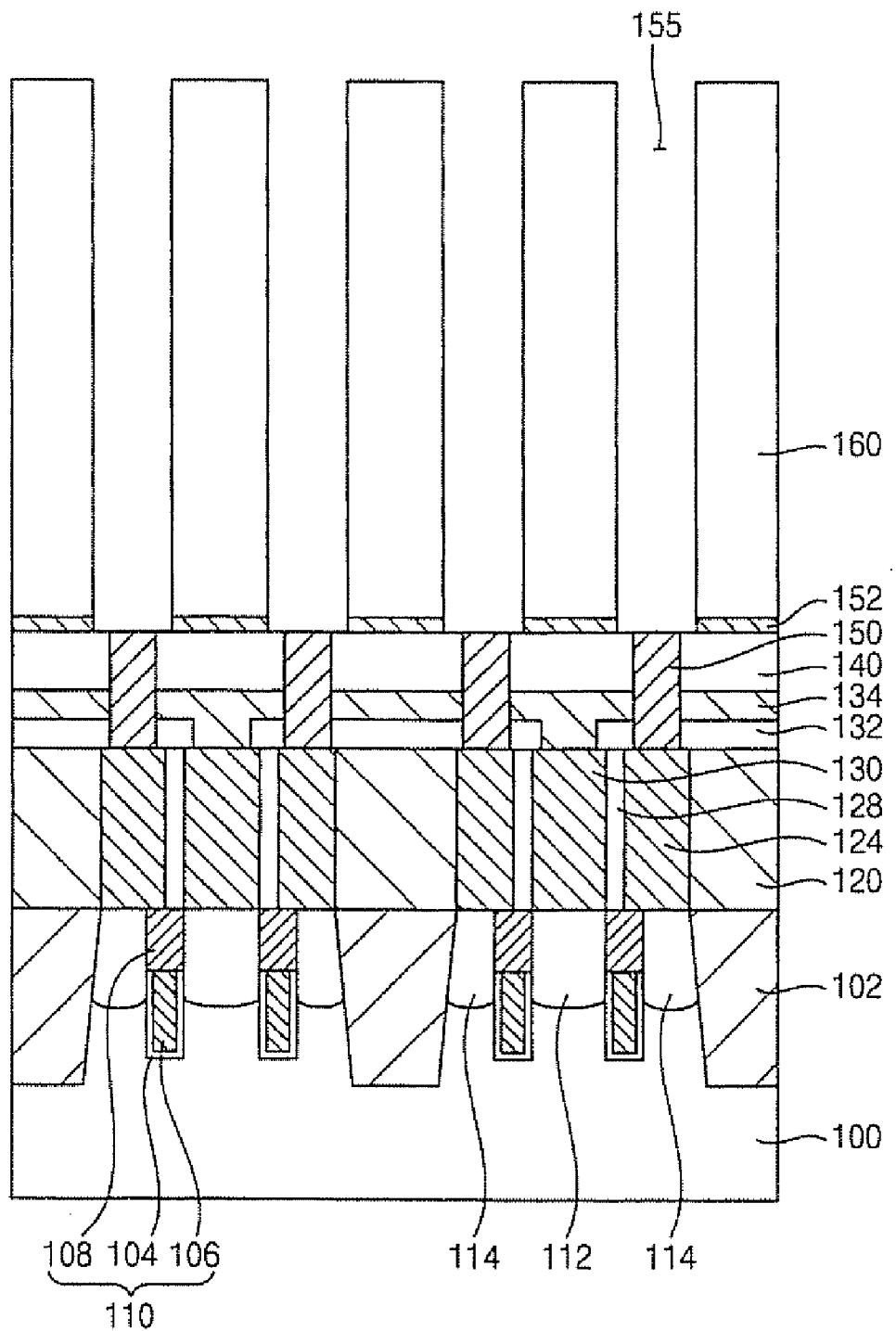

Referring to FIG. 3C, an etch stop layer 152 is formed on the third conductive pads 150 and the third insulating interlayer 140. The etch stop layer 152 may protect the third conductive pads 150 in a subsequent etching process that is used to form third openings 155 through a subsequently formed mold layer 160. The etch stop layer 152 may have a thickness of, for example, about 10 Å to about 200 Å. The etch stop layer 152 may be formed using a material that has an etching selectivity with respect to the mold layer 160. For example, the etch stop layer 152 may be formed using nitride or metal oxide.

The mold layer 160 is formed on the etch stop layer 152. The mold layer 160 may be formed using an oxide such as TEOS, HDP-CVD oxide, PSG, BPSG, USG, SOG, etc. In example embodiments, the mold layer 160 may have a multi-layered structure that includes at least two films composed of oxides having different etching rates. When the mold layer 160 includes the oxides having the different etching rates, a sidewall of the lower electrode 170 may vary in accordance with a shape of the third opening 155.

In some example embodiments, a thickness of the mold layer 160 may be adjusted based on a desired storage capacitance of the semiconductor device, since the storage capacitance of the semiconductor device may depend on the thickness of the mold layer 160.

As is also shown in FIG. 3C, the mold layer 160 and the etch stop layer 152 are partially etched to form the third openings 155 that expose the third conductive pads 150, respectively. The third openings 155 may be formed by a wet etching process or a dry etching process.

Figure 3D:
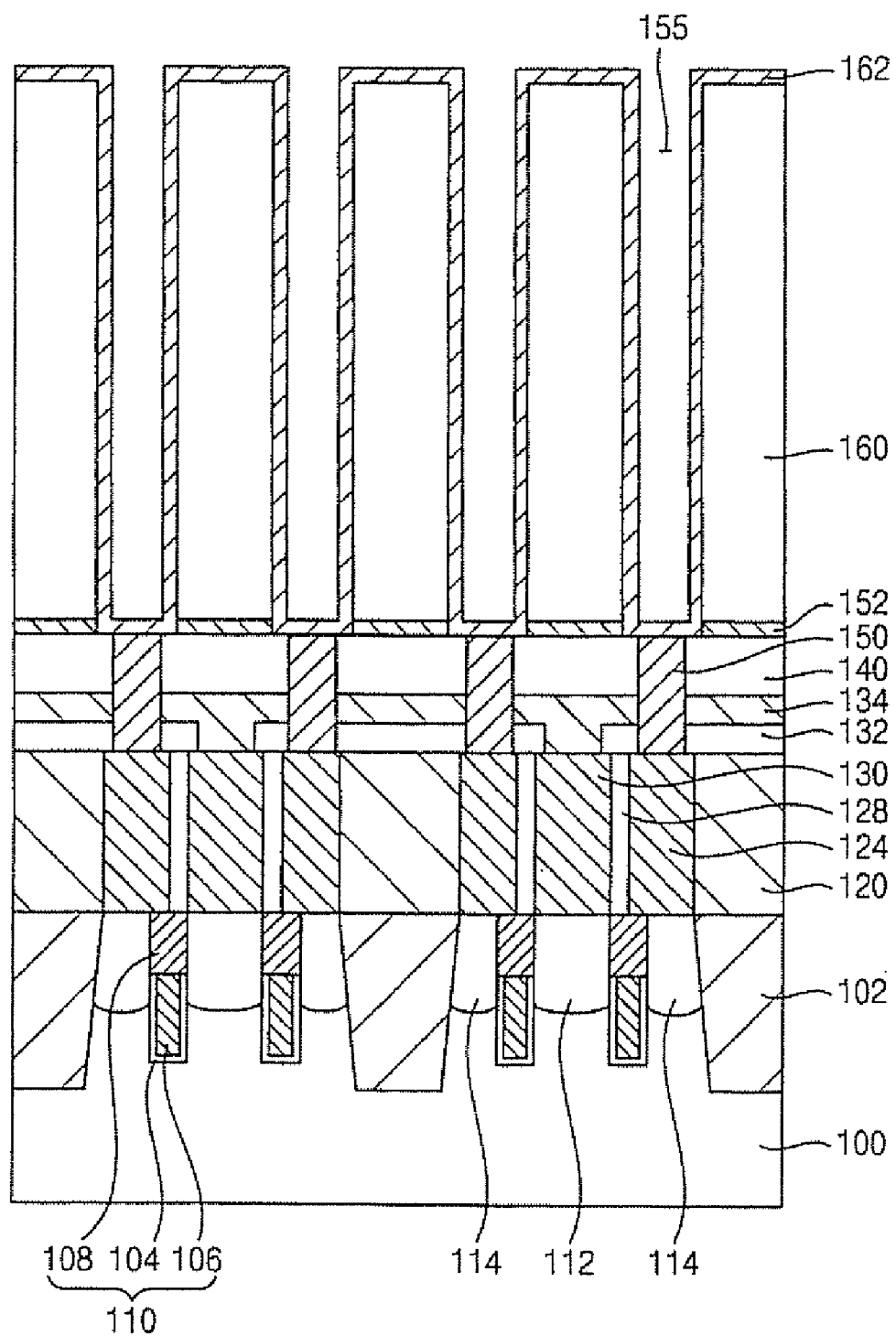

Referring to FIG. 3D, a lower electrode formation layer 162 is conformally formed on bottoms and sidewalls of the third openings 155 and on the mold layer 160. The lower electrode formation layer 162 may be formed of a material substantially the same or substantially different from those of the third conductive pads 150. For example, the lower electrode formation layer 162 may be formed using titanium, titanium nitride, tungsten, tungsten nitride, tantalum, tantalum nitride, etc. The lower electrode formation layer 162 may be formed by a CVD process, a cyclic CVD process, an ALD process, a PLD process, a sputtering process, an evaporation process, etc. In example embodiments, the lower electrode formation layer 162 may have a multi-layered structure that includes a titanium film and a titanium nitride film.

Figure 3E:
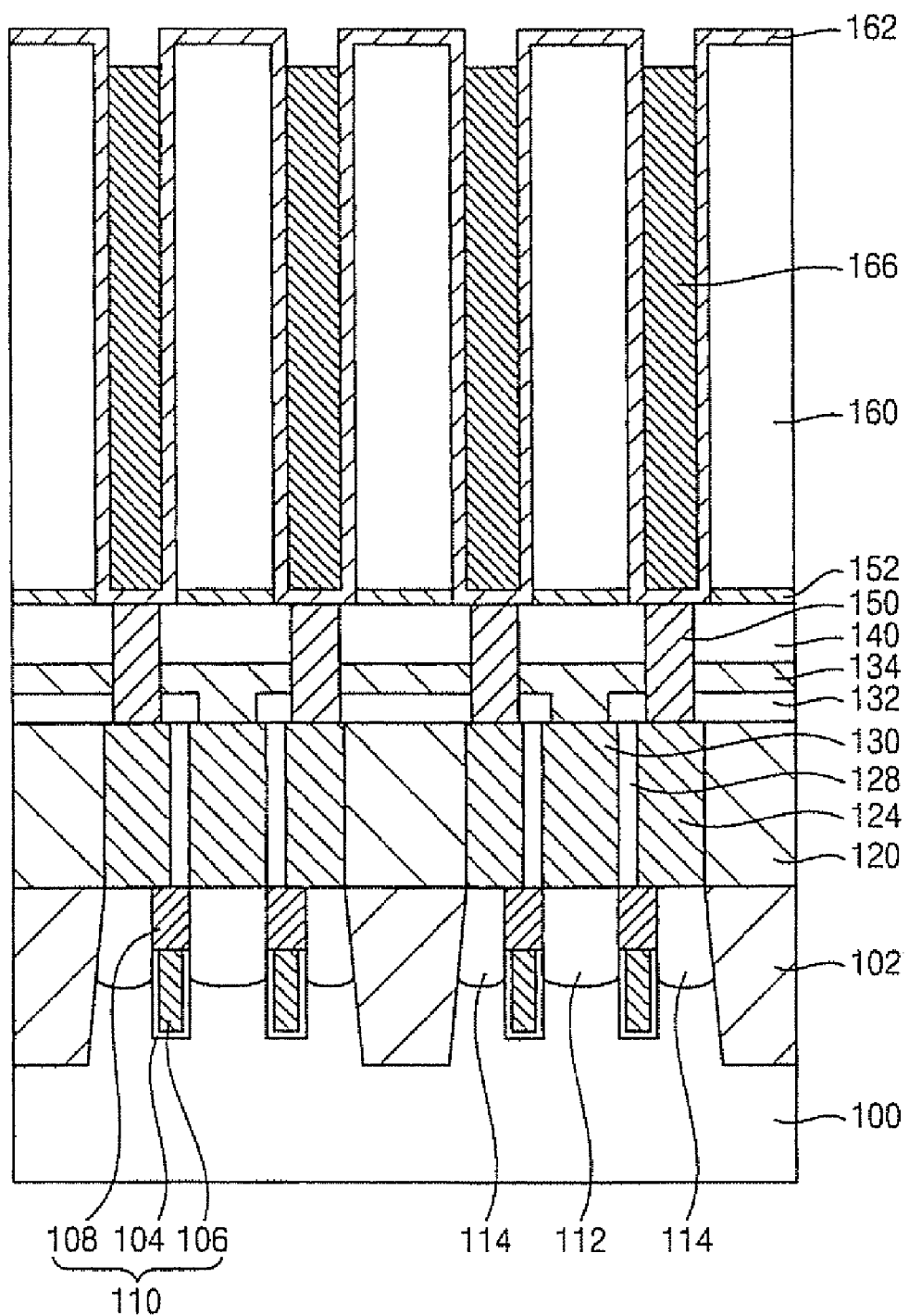
Figure 3F:
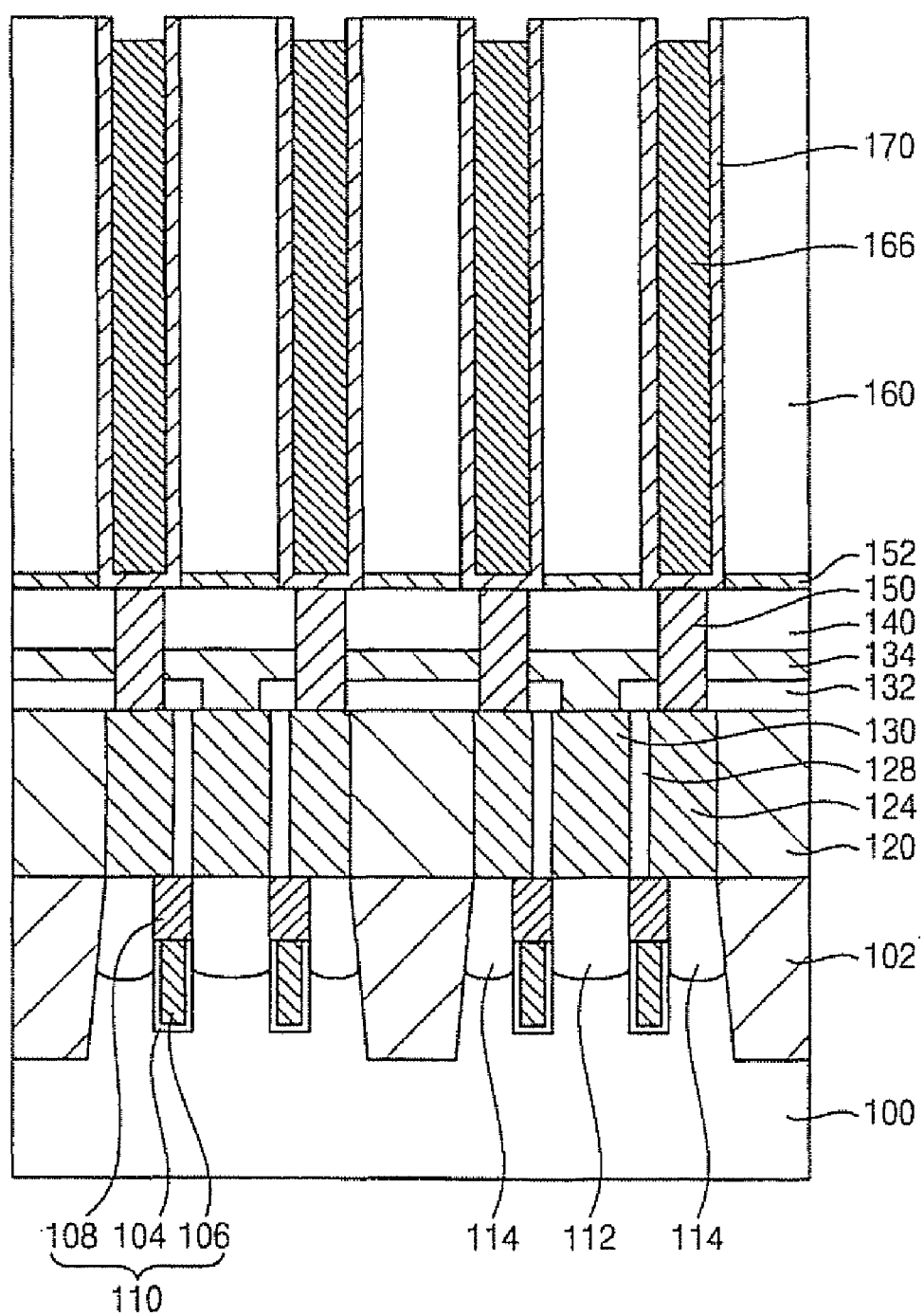
Figure 3G:
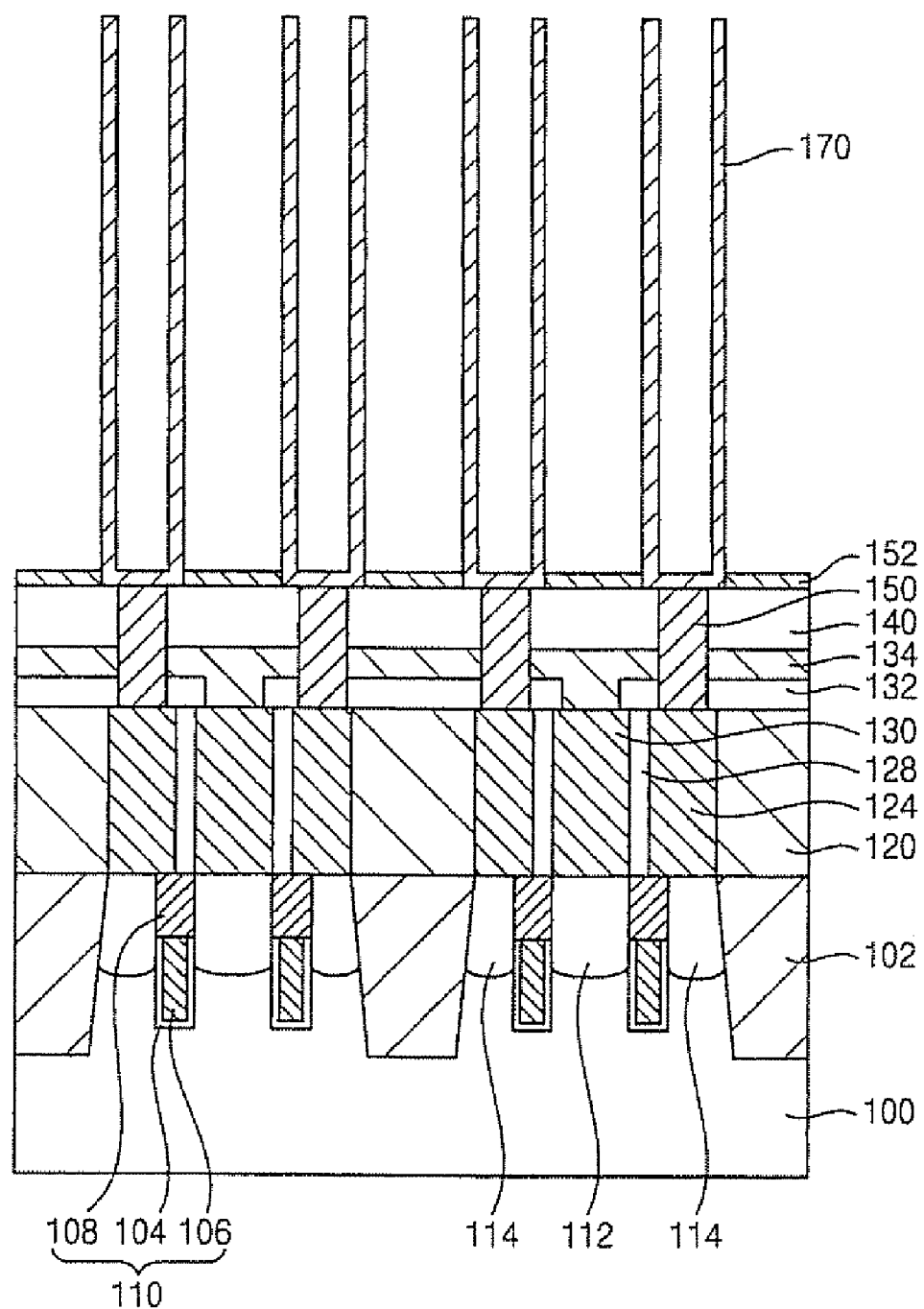
Figure 3H:
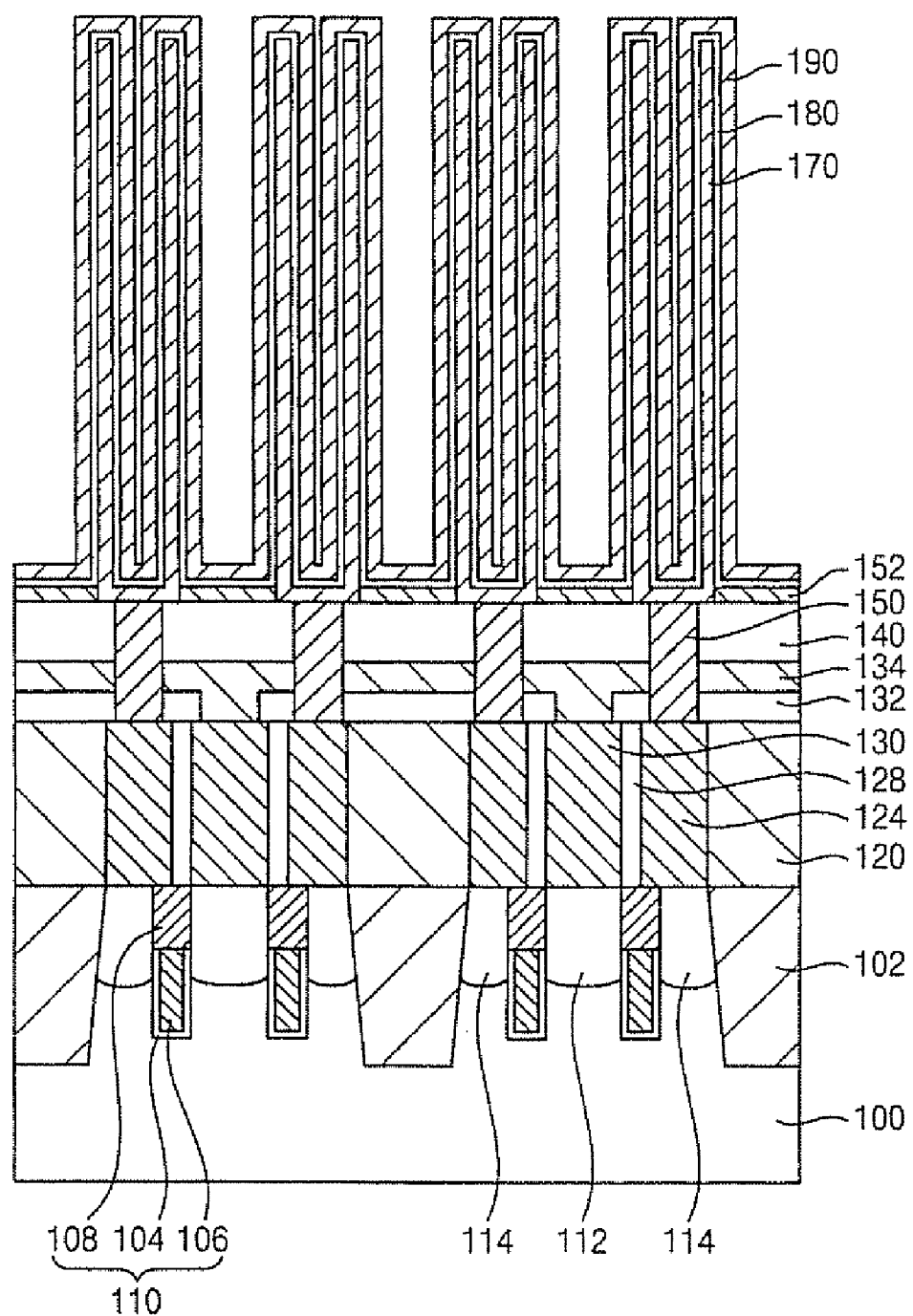

When the lower electrode formation layer 162 is formed using metal and/or metal nitride, a depletion layer may be reduced, minimized or prevented at an interface between the lower electrode 170 and a dielectric layer 180 (see FIG. 3H). Therefore, a semiconductor device may have an improved storage capacitance.

As shown in FIG. 3D, the third openings 155 may have a high aspect ratio. Thus, in some embodiments, the lower electrode formation layer 162 may be conformally formed on the inside sidewalls of the third openings 155 so that the lower electrode formation layer 162 may have good step coverage. Further, the lower electrode formation layer 162 may be sufficiently thin such that it does not fill the third openings 155.

In some embodiments, the lower electrode formation layer 162 may be formed by a CVD process, a cyclic CVD process, an ALD process, etc.

As shown in FIG. 3E, buffer layer patterns 166 maybe formed on the lower electrode formation layer 162. The buffer layer patterns 166 may partially fill the third openings 155, respectively.

In some embodiments, the buffer layer patterns 166 may be formed as follows. A buffer layer (not illustrated) is formed on the lower electrode formation layer 162 to fully fill up the third openings 155. The buffer layer may be formed using photoresist or silicon oxide. For example, the buffer layer may be formed using SOG. The buffer layer is then partially removed to expose the lower electrode formation layer 162 and to form the buffer layer patterns 166 in the third openings 155. The buffer layer patterns 166 may be formed by a wet etching process using an etching solution that includes hydrogen fluoric acid. Each of the buffer layer patterns 166 may have an upper face that is substantially lower than an upper face of the mold layer 160.

Referring to FIG. 3F, the lower electrode formation layer 162 is partially removed to form the lower electrode 170. That is, portions of the lower electrode formation layer 162 on the mold layer 160 are etched using the buffer layer patterns 166 as etching masks to thereby form the lower electrodes 170 on the bottoms and the sidewalls of the third openings 155. In some example embodiments, each of the bottom electrodes 170 may have a cylindrical shape or a polygonal pillar shape. An inside of the bottom electrode 170 may be covered with the buffer layer pattern 166 whereas a sidewall of the bottom electrode 170 is enclosed by the mold layer 160.

Referring to FIG. 3G, the mold layer 160 and the buffer layer patterns 166 are removed. The mold layer 160 and the buffer layer patterns 166 may be removed by a wet etching process using an etching solution. When the mold layer 160 and the buffer layer patterns 166 includes oxides, respectively, the mold layer 160 and the buffer layer patterns 166 may be simultaneously removed using an etching solution such as an LAL solution that includes deionized water, hydrogen fluoric acid and ammonium fluoride. In example embodiments, additives and surfactants may be added to the etching solution so as to prevent corrosion of the bottom electrodes 170 and/or re-adhesion of oxide to the bottom electrodes 170.

Referring to FIG. 3H, a dielectric layer 180 is conformally formed on the lower electrode 170. The dielectric layer 180 may be formed using a metal oxide that has a high dielectric constant. For example, the dielectric layer 180 may be formed using hafnium oxide, aluminum oxide, zirconium oxide, tantalum oxide, etc. The dielectric layer 180 may be formed by an ALD process, a sputtering process, a CVD process, etc.

An upper electrode 190 is formed on the dielectric layer 180 to provide the semiconductor device on the substrate 100. The upper electrode 190 may be formed using a metal, a metal compound or doped polysilicon. In some embodiments, the upper electrode 190 may have a multi-layered structure that includes a polysilicon film, a metal film and/or a metal compound film.

According to some example embodiments of the present invention, various conductive pads in a semiconductor device may be formed without a self-alignment process. Further, adjacent conductive pads may be electrically insulated along a horizontal direction by a spacer without an electrical short between adjacent conductive pads, and an upper conductive pad may stably make contact with a lower conductive pad by ensuring a sufficient error margin. Therefore, the semiconductor device may have improved electrical characteristics and/or an enhanced reliability.

The foregoing is illustrative of the present invention and is not to be construed as limiting thereof. Although a few example embodiments of the present invention have been described, those skilled in the art will readily appreciate that many modifications are possible in the example embodiments without materially departing from the novel teachings and advantages of the present invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The present invention is defined by the following claims, with equivalents of the claims to be included therein.

What is claimed is:

1. A method of forming a pad structure, comprising:
    forming a first contact region and second contact regions in an active region of a substrate;
    forming an insulating interlayer on the substrate, the insulating interlayer including a first opening that exposes the first contact region and the second contact regions;
    forming first conductive pads in the first opening, wherein each first conductive pad is in electrical contact with a respective one of the second contact regions;
    forming spacers, wherein each spacer is on a sidewall of a respective one of the first conductive pads; and
    forming a second conductive pad between the first conductive pads, wherein the second conductive pad is in electrical contact with the first contact region.

2. The method of claim 1, wherein forming the first conductive pads in the first opening comprises:
    forming a conductive layer pattern in the first opening on the first contact region and second contact regions; and
    etching the conductive layer pattern to form a second opening that exposes the second contact region and to divide the conductive layer pattern into the first conductive pads.

3. The method of claim 2, wherein a width of the second opening exceeds a width of the first contact region.

4. The method of claim 3, wherein a sidewall of each of the spacers is substantially aligned with a respective sidewall of the first contact region.

5. The method of claim 1, the method further comprising:
    forming a recess in the active region;
    forming a gate insulation layer inside the recess;
    forming a gate electrode on the gate insulation layer to partially fill the recess; and
    forming a gate mask on the gate electrode, and
    wherein the first opening further exposes the gate mask.

6. The method of claim 5, the method further comprising:
    forming a second recess in the active region;
    forming a second gate insulation layer inside the second recess;
    forming a second gate electrode on the second gate insulation layer to partially fill the second recess; and
    forming a second gate mask on the second gate electrode, and
    wherein the first opening further exposes the second gate mask.

7. The method of claim 5, wherein an upper surface of the gate mask is substantially planar with an upper surface of the substrate.

8. The method of claim 1, wherein the width of second conductive pad is substantially greater than a width of each of the first conductive pads.

9. The method of claim 8, wherein a width of each spacer is substantially smaller that the widths of each of the first conductive pads and the width of the second conductive pad.

10. A method of manufacturing a semiconductor device, the method comprising:
    forming a recessed channel transistor in an active region of a substrate, the recessed channel transistor including a recessed gate structure, a first contact region and second contact regions;
    forming a first insulating interlayer on the substrate;
    etching the first insulating interlayer to form a first opening that exposes the active region;
    forming a first conductive layer pattern in the first opening;
    etching the first conductive layer pattern to form a second opening that exposes the first contact region while dividing the first conductive layer pattern into first conductive pads that are separated by the second opening;
    forming spacers, wherein each spacer is on a sidewall of a respective one of the first conductive pads; and
    forming a second conductive pad in the second opening.

11. The method of claim 10, wherein an upper surface of the recessed gate structure is substantially planar with an upper surface of the substrate.

12. The method of claim 10, wherein forming the recessed channel transistor comprises:
    forming a recess in the active region;
    forming a gate insulation layer inside the recess;
    forming a gate electrode on the gate insulation layer to partially fill the recess; and
    forming a gate mask on the gate electrode.

13. The method of claim 12, the method further comprising:
    forming a second recess in the active region;
    forming a second gate insulation layer inside the second recess;
    forming a second gate electrode on the second gate insulation layer to partially fill the second recess; and
    forming a second gate mask on the second gate electrode.

14. The method of claim 13, wherein forming the second conductive pad comprises:
    forming a second conductive layer on the first conductive pads, on the first insulating interlayer and within the second opening; and
    removing an upper surface of the second conductive layer to expose the first conductive pads.

15. The method of claim 10, wherein the second conductive pad directly contacts the first contact region, and each of the first conductive pads directly contacts a respective one of the second contact regions.

16. The method of claim 10, wherein a portion of the recessed gate structure is exposed through the second opening.

17. The method of claim 16, wherein a sidewall of each of the spacers is substantially aligned with a respective sidewall of the first contact region.

18. The method of claim 10, wherein forming the spacers comprises:
    conformally forming a spacer formation layer on a bottom and sidewalls of the second opening, the first conductive pads and the first insulating interlayer; and
    partially removing the spacer formation layer to expose the first contact region.

19. The method of claim 10, further comprising:
    forming a second insulating interlayer on the first insulating interlayer, the first conductive pads, the spacers and the second conductive pad;
    partially etching the second insulating interlayer to form a first contact hole that exposes the second conductive pad; and
    forming a wiring on the second insulating interlayer and in the first contact hole.

20. The method of claim 19, further comprising:
    forming a third insulating interlayer on the second insulating interlayer and on the wiring;
    partially etching the third insulating interlayer to form second contact holes that expose respective ones of the first conductive pads; and
    forming third conductive pads in respective ones of the second contact holes, wherein each of the third conductive pads is in direct contact with a respective one of the first conductive pads.

21. The method of claim 1, wherein the spacers have etching selectivity relative to the insulating interlayer, the first conductive pads and the second conductive pad.

22. The method of claim 21, wherein the spacers are formed using oxides or oxynitrides.

23. The method of claim 1, wherein each of the first conductive pads and the second conductive pad include at least one of polysilicon doped with impurities, a metal or a metal compound.

24. The method of claim 10, wherein forming the first conductive layer pattern comprises:
    forming a first conductive layer on the first insulating interlayer and within the first opening; and
    removing an upper surface of the first conductive layer to expose the first insulating interlayer.

* * * * *